(12) United States Patent
Cross

(10) Patent No.: US 6,649,960 B1
(45) Date of Patent: Nov. 18, 2003

(54) SYNTHETIC FREE LAYER STRUCTURE FOR MRAM DEVICES

(75) Inventor: Ralph William Cross, Lyons, CO (US)

(73) Assignee: Maxtor Corporation, Longmont, CO (US)

( * ) Notice: Subject to any disclaimer, the term of this patent is extended or adjusted under 35 U.S.C. 154(b) by 0 days.

(21) Appl. No.: 10/025,271

(22) Filed: Dec. 18, 2001

Related U.S. Application Data

(60) Provisional application No. 60/269,518, filed on Feb. 16, 2001.

(51) Int. Cl.[7] ............................................... H01L 29/72
(52) U.S. Cl. ........................ 257/296; 257/158; 257/171
(58) Field of Search ........................... 257/296; 365/171, 365/158

(56) References Cited

U.S. PATENT DOCUMENTS

2002/0006058 A1 * 1/2002 Nakajima et al. ........... 257/296

* cited by examiner

Primary Examiner—Edward Wojciechowicz

(57) ABSTRACT

An MRAM cell includes a bottom electrode layer, a magnetic reference layer, an insulating layer, a synthetic free layer, and a top electrode layer. The synthetic free layer includes a first magnetic layer, a ruthenium anti-ferromagnetic coupling layer, and a second magnetic layer. The magnetic reference layer and the first and second magnetic layers are fabricated using magnetic materials such as CoFeB, CoFe, or a bilayer of NiFe and CoFe. The first magnetic layer of the synthetic free layer is made thicker than the second magnetic layer of the synthetic free layer for proper operation.

39 Claims, 2 Drawing Sheets

SYNTHETIC FREE LAYER STRUCTURE FOR MRAM DEVICES

CROSS-REFERENCE TO RELATED APPLICATION

This application claims the benefit of U.S. Provisional Application No. 60/269,518, filed Feb. 16, 2001 which is incorporated in its entirety by reference herein.

BACKGROUND OF THE INVENTION

1. Field of Invention

The present invention pertains to the field of magnetic memories. More particularly, this invention relates to an improved free layer structure in a magnetic storage cell.

2. Background of the Invention

A magnetic memory such as a magnetic random access memory (MRAM) typically includes one or more magnetic storage cells. Referring now to FIG. 1, each magnetic storage cell 10 usually includes an active or "free layer" 18 and a reference layer 14, separated by a spacer layer 16. The magnetic storage cell 10 is electrically contacted via a bottom electrode layer 12 and a top electrode layer 20. The active layer 14 is usually a single layer of magnetic material such as CoFeB, CoFe, CoFeNi or a bilayer of NiFe and CoFe that stores magnetization patterns in orientations that may be altered by the application of magnetic switching fields. The reference layer 14 is usually a layer of magnetic material in which magnetization is fixed or "pinned" in a particular direction. The reference layer 14 is therefore sometimes referred to as the "pinned layer".

Referring now to FIG. 2, an array 15 of MRAM memory cells is shown in which the bottom electrode 12 has been extended to form a sense line and the top electrode 20 has been extended to form an orthogonal write line. An optional additional write line 12A is also shown in FIG. 2. While three sets of write lines and sense lines are shown, the number can be extended to any number of rows and columns required as is known by those skilled in the art. Array 15 is arranged in cross-point array fashion wherein an MRAM cell 10 is placed at every intersection of a sense and write line. Each MRAM cell 10 in array 15 can be turned on separately by choosing a desired sense line and a desired write line. The switching of the free layer 18 into a logic one or zero state is therefore accomplished by the energizing of the two selected sense and write lines. A high current is used to write. The polarity of the current determines the logic state of the MRAM cell. Also, an independent write line 12A can be used in combination with the current lines to switch the desired MRAM cell 10. These additional lines help to ensure that switching of only the selected MRAM cell 10. Additional write lines 12A run parallel to the current lines.

Returning to FIG. 1, the logic state of a magnetic storage cell 10 as shown in typically depends on its resistance to electrical current flow. Its resistance usually depends on the relative orientations of magnetization in its active and reference layers 18 and 14. Magnetic storage cell 10 is typically in a low resistance state if the overall orientation of magnetization in its active layer 18 is parallel to the orientation of magnetization in its reference layer 14. In contrast, magnetic storage cell 10 is typically in a high resistance state if the overall orientation of magnetization in its active layer 18 is anti-parallel to the orientation of magnetization in its reference layer 14. Magnetic storage cell 10 is usually written to a desired logic state by applying magnetic switching fields that rotate the orientation of magnetization in its active layer 18. It is usually desirable that a magnetic switching field of a predictable magnitude in one direction switch magnetic storage cell 10 to its low resistance state and a magnetic switching field of the same predictable magnitude in the opposite direction switch the magnetic storage cell 10 to its high resistance state. Such switching behavior may be referred to as symmetric switching characteristics. Unfortunately, a variety of effects commonly found in prior magnetic storage cells may disrupt magnetization in an active layer and create asymmetric switching characteristics.

For example, the reference layer 14 in a typical prior magnetic storage cell 10 generates demagnetization fields that push the magnetization in the active layer 18 toward the anti-parallel orientation. These demagnetization fields usually increase the threshold magnitude of the magnetic switching field needed to rotate the active layer to the low resistance state and decrease the threshold magnitude of the magnetic switching field needed to rotate the active layer to the high resistance state. This typically increases the power needed to write the magnetic storage cell to the low resistance state and may cause accidental writing to the high resistance state. In extreme cases, these demagnetization fields may cause a magnetic storage cell to remain in the high resistance state regardless of the applied magnetic switching fields history.

In addition, coupling fields between the reference layer 14 and the active layer 18 in a prior magnetic storage cell 10 usually push the magnetization in its active layer toward the parallel orientation. These coupling fields usually increase the power needed to write a magnetic storage cell 10 to the high resistance state and may cause accidental writing to the low resistance state. In extreme cases, these coupling fields may cause a magnetic storage cell to remain in the low resistance state regardless of the applied magnetic switching fields history.

Moreover, the degree of disruption to the magnetization in an active layer 18 caused by demagnetization and coupling fields may vary among the magnetic storage cells 10 in an MRAM array (MRAM array not shown in FIG. 1). In addition, such disruptions may vary between different MRAM arrays due to variation in the patterning steps and/or deposition steps of device manufacture. Such variations typically produces uncertainty as to the behavior of individual magnetic storage cells during write operations.

Further, conventional MRAM devices cannot be stabilized (i.e. free layer 18 cleanly returning to high and low logic states) as in conventional read head technology since the devices need to flip between two logic states. As the MRAM device is made smaller, a larger demagnetizing field is required which results in larger switching fields, domain formation, and noise. Consequently very large currents are required to switch very small devices. The thickness of free layer 18 cannot be reduced indefinitely without a corresponding loss in signal. A thinner free layer 18 becomes less thermally stable as well.

Given the present state of the art, there presently are no stabilization techniques used for an MRAM cell other than shape anisotropy using an elliptical cell shape. Some designs require making ellipses at sub-micron sizes, which is not practical. Also, there is no guarantee that the elliptical shape will completely stabilize all of the cells. With the conventional design, there is a direct tradeoff between switching field and GMR (giant magnetoresistive) response. The thinner the free layer used to reduce the switching field, the smaller the GMR response. In addition, the switching fields are much larger for the conventional design.

What is desired, therefore, is a more practical MRAM design that can properly function at small feature sizes and higher integration densities.

SUMMARY OF THE INVENTION

According to the present invention, a synthetic free layer structure into MRAM (Magnetic Random Access Memory) devices improves magnetic stability, thermal stability, output signal strength, and switching field control. The synthetic free layer includes two magnetic layers typically formed of a magnetic material such as NiFe, CoFe, CoFeNi, or CoFeB separated and antiferromagnetically (AF) coupled together using a layer of Ruthenium (Ru). Ruthenium strongly AF couples the two magnetic layers to produce a reduced-moment free layer. The synthetically coupled free layer has better stability due to the strong AF coupling that reduces the magnetostatic fields at the device edges. The AF coupled films are in a stable, low-energy state. The output signal strength is improved because the GMR response is maximized while being able to reduce the switching field by reducing the effective magnetic thickness of the free layer. The effective magnetic thickness is the difference between the magnetization of the two AF-coupled layers. The effectively thinner free layer design advantageously reduces the required switching field, and can be designed from near zero to any desired value. The synthetic free layer allows the switching field to be adjusted independently from the GMR response.

It is an advantage of the present invention that stability is improved, i.e. the strongly AF coupled magnetic layers in the synthetic free layer are in a stable configuration having a reduced moment and correspondingly reduced demagnetizing fields.

It is an advantage of the present invention that switching field control can be easily achieved, and the switching field itself can be adjusted as desired from near zero field strength to any desired value.

It is a further advantage of the present invention that GMR response is maximized since the component layers of the synthetic free layer can remain thick.

It is a further advantage of the present invention that thermal stability is maximized and thermal noise is reduced since the component layers of the synthetic free layer can remain thick.

It is a further advantage of the present invention that while the effective magnetic thickness is related to the difference between the two AF coupled layer thicknesses in the synthetic free layer, the thermal stability is improved and is related to the sum of those thicknesses.

The foregoing and other objects, features and advantages of the invention will become more readily apparent from the following detailed description of a preferred embodiment of the invention which proceeds with reference to the accompanying drawings.

DETAILED DESCRIPTION

Figure 1:
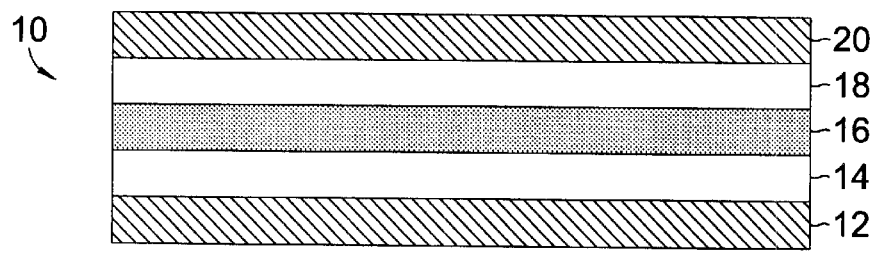
FIG. 1 is a cross-sectional diagram of a typical prior art MRAM cell showing a bottom electrode layer, a reference layer, a spacer layer, a free layer, and a top electrode layer.
Figure 3:
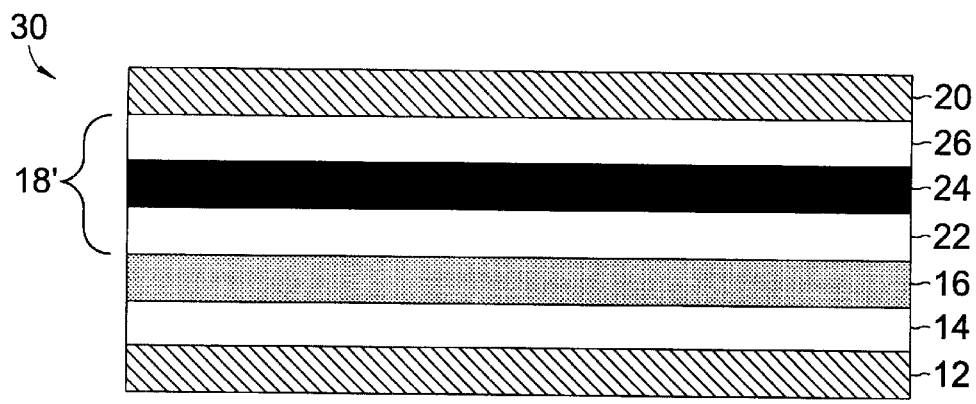
FIG. 3 is a cross-sectional diagram of an MRAM cell fabricated according to the present invention showing a bottom electrode layer, a reference layer, a spacer layer, and a synthetic free layer including a first magnetic layer, a ruthenium AF coupling layer, a second magnetic layer, as well as a top electrode layer.

Referring now to FIG. 3, a tri-layer synthetic free layer 18' is shown and substituted in place of the single free layer 18 shown in the prior art MRAM cell 10 of FIG. 1. Stability is improved due to two magnetic layers 22 and 24 being AF (anti-ferromagnetically) coupled together, as is explained in further detail below. The structure of layers 22 and 24 produces a low energy state in which the demagnetizing fields from each of the two layers 22 and 24 help to stabilize each other. The effective magnetic thickness, which determines the switching field, is essentially the difference between the magnetization of the two layers 22 and 24. The inner layer 22 is kept thicker than the outer layer 24 to maximize GMR response. In this way, inner layer 22 can be adjusted to achieve the highest possible GMR response, while the outer layer is used to adjust and reduce the switching field as desired, as necessary for the desired application.

Figure 2:
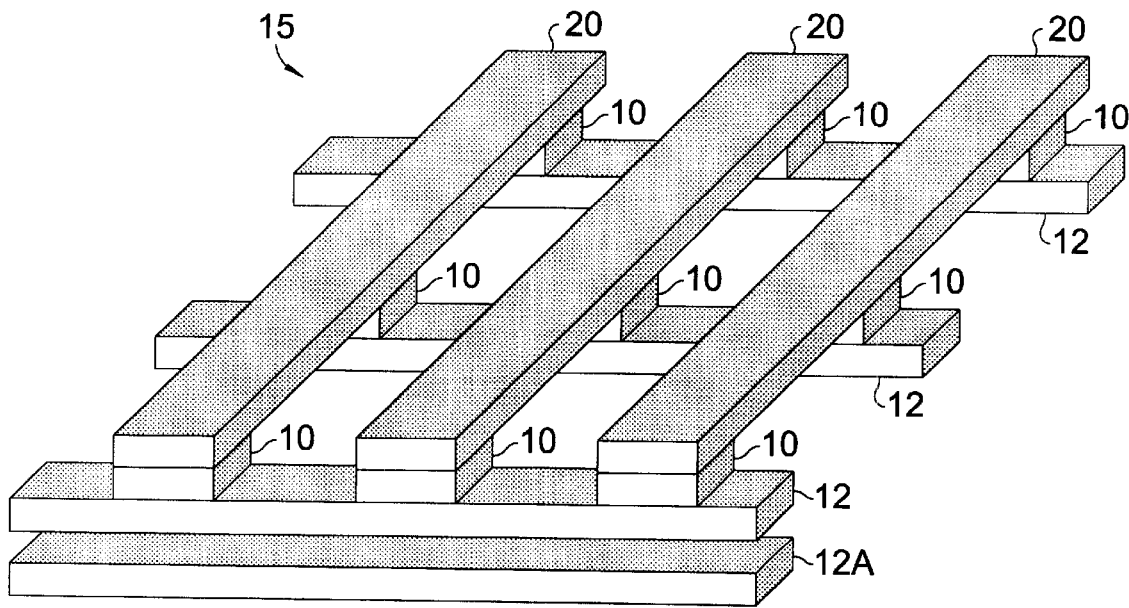
FIG. 2 is a cross-point array of MRAM cells, with corresponding orthogonal sense and write lines coupled to the MRAM cells.

Referring again to FIG. 2, an improved MRAM cell 30 includes a bottom electrode layer 12, a magnetic reference layer 14, a spacer layer 16, a synthetic free layer 18', and a top electrode layer 20. The synthetic free layer 18' includes a first magnetic layer 22, an AF coupling layer 24, and a second magnetic layer 26. The magnetic reference layer 14 is typically a magnetic material such as CoFeB, CoFe, or a bilayer of NiFe and CoFe. The spacer layer 16 is typically formed of $Al_2O_3$ or copper. The first magnetic layer 22 in the synthetic free layer 18' is also a magnetic material such as CoFeB, CoFeNi, or a bilayer of NiFe and CoFe. The AF coupling layer 24 in the synthetic free layer 18' is preferably a ruthenium layer. The second magnetic layer 26 in the synthetic free layer 18' uses the same magnetic materials described above. Layers 22 and 26 can be made between about two to five nm thick (if CoFeB or CoFeNi is used), or two to four nm thick plus one to two nm thick for the NiFe/CoFe bilayer structure. Ruthenium layer 24 is between 0.6 to one nm thick. A typical design for the synthetic free layer 18' would be a four nm CoFeNi layer 22, a 0.8 nm Ruthenium layer 24, and a three nm CoFeNi layer 26, which gives an effective free layer thickness of one nm. The top electrode 20 can be made of the same material as the bottom electrode 12.

Figure 4:
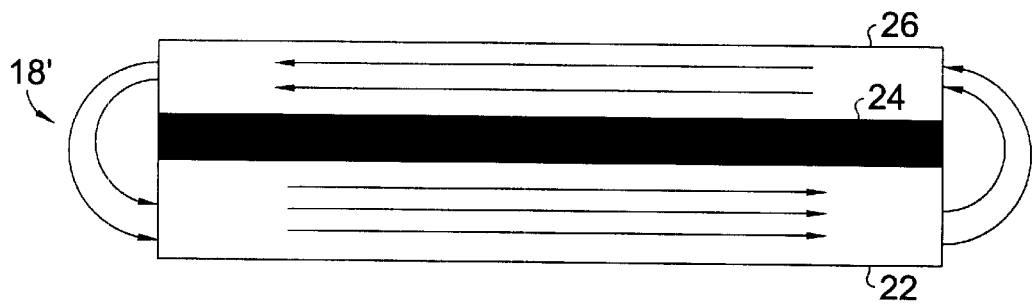
FIG. 4 is a cross-sectional diagram of the synthetic free layer of FIG. 2 showing the direction and flow of the magnetic flux lines, as well as the relative thicknesses of the first and second magnetic layers.

Referring now to FIG. 4, a cross-sectional diagram of the synthetic free layer 18' is shown in which the relative thicknesses of the first and second magnetic layers 22 and 26 are compared. Note that the first magnetic layer 22 is thicker than the second magnetic layer 26 for the reasons given above. The direction and flow of the magnetic flux lines is also shown in FIG. 4.

In a fabrication method of the MRAM cell, the layers are formed in order as follows: the bottom electrode layer 12; the magnetic reference layer 14; insulating layer 16; synthetic free layer 18' including the first magnetic layer 22, the AF coupling layer 24, and the second magnetic layer 26; and the top electrode layer 20. The individual layers can be formed and etched using conventional sputtering or other deposition techniques, and etched either singly or together as is known in the art.

Figure 5:
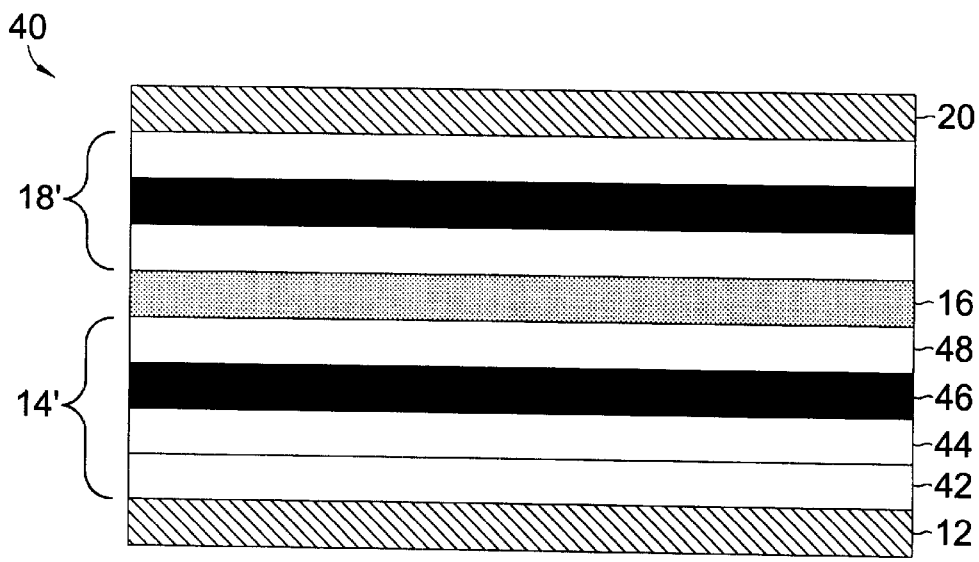
FIG. 5 is a cross-sectional diagram of an MRAM cell fabricated according to the present invention including both a synthetic free layer and a synthetic pinned layer.

Referring now to FIG. 5, an alternative MRAM cell 40 is shown, having a structure similar to that described above with respect to FIGS. 3 and 4, but having a synthetic pinned layer 14' including a PtMn pinning layer 42, first and second CoFe pinned layers 44 and 48, as well as a Ruthenium AF coupling layer 46. A desired structure for the synthetic pinned layer 14' would include a three nm thick layer 44, a 0.8 mu thick layer 46, and a three nm thick layer 48.

The annealing of the MRAM cell structure shown in FIGS. 3 and 5 can be accomplished using an anneal similar to those used for GMR heads having PtMn pinning layers. An anneal in a 10 kOe field at 240 degrees centigrade for about four to six hours is used, with the annealing field in the longitudinal direction.

Having described and illustrated the principle of the invention in a preferred embodiment thereof, it is appreciated by those having skill in the art that the invention can be modified in arrangement and detail without departing from such principles. For example, the exact layer thicknesses and choice of materials can be changed as desired to meet the requirements of a specific application. I therefore claim all modifications and variations coming within the spirit and scope of the following claims.

I claim:

1. An MRAM cell comprising:
   a bottom electrode layer;
   a magnetic reference layer;
   an insulating layer;
   a synthetic free layer including a first magnetic layer, an AF coupling layer, and a second magnetic layer; and
   a top electrode layer.

2. The MRAM cell as in claim 1 in which the magnetic reference layer comprises a synthetic magnetic reference layer.

3. The MRAM cell as in claim 1 in which the magnetic reference layer comprises a material selected from the group consisting of CoFeB, CoFe, CoFeNi, and a bilayer of NiFe/CoFe.

4. The MRAM cell as in claim 1 in which the first magnetic layer in the synthetic free layer comprises a material selected from the group consisting of CoFeB, CoFe, CoFeNi, and a bilayer of NiFe/CoFe.

5. The MRAM cell as in claim 1 in which the first magnetic layer in the synthetic free layer comprises a magnetic layer about two to six nm thick.

6. The MRAM cell as in claim 1 in which the AF coupling layer in the synthetic free layer comprises a ruthenium layer.

7. The MRAM cell as in claim 1 in which the AF coupling layer in the synthetic free layer comprises a layer about 0.6 to one nm thick.

8. The MRAM cell as in claim 1 in which the second magnetic layer in the synthetic free layer comprises a material selected from the group consisting of CoFeB, CoFe, and a bilayer of NiFe/CoFe.

9. The MRAM cell as in claim 1 in which the second magnetic layer in the synthetic free layer comprises a magnetic layer about two to six nm thick.

10. The MRAM cell as in claim 1 in which the first magnetic layer of the synthetic free layer is thicker than the second magnetic layer of the synthetic free layer.

11. A method of forming an MRAM cell comprising:
    forming a bottom electrode layer;
    forming a magnetic reference layer;
    forming an insulating layer;
    forming a synthetic free layer including a first magnetic layer, an AF coupling layer, and a second magnetic layer; and
    forming a top electrode layer.

12. The method of claim 11 in which forming the magnetic reference layer comprises forming a synthetic magnetic reference layer.

13. The method of claim 11 in which forming the magnetic reference layer comprises forming a layer of material selected from the group consisting of CoFeB, CoFe, and a bilayer of NiFe/CoFe.

14. The method of claim 11 in which forming the first magnetic layer in the synthetic free layer comprises forming a layer material selected from the group consisting of CoFeB, CoFe, and a bilayer of NiFe/CoFe.

15. The method of claim 11 in which forming the first magnetic layer in the synthetic free layer comprises forming a magnetic layer about two to six nm thick.

16. The method of claim 11 in which forming the AF coupling layer in the synthetic free layer comprises forming a ruthenium layer.

17. The method of claim 11 in which forming the AF coupling layer in the synthetic free layer comprises forming a layer about 0.6 to one nm thick.

18. The method of claim 11 in which forming the second magnetic layer in the synthetic free layer comprises forming a layer of material selected from the group consisting of CoFeB, CoFe, and a bilayer of NiFe/CoFe.

19. The method of claim 11 in which forming the second magnetic layer in the synthetic free layer comprises forming a magnetic layer about two to six nm thick.

20. The method of claim 11 further comprising forming the first magnetic layer of the synthetic free layer to have a thickness greater than that of the second magnetic layer of the synthetic free layer.

21. A synthetic free layer for an MRAM cell comprising:
    a first magnetic layer;
    an AF ruthenium coupling layer; and
    a second magnetic layer, wherein the first magnetic layer is thicker than the second magnetic layer.

22. An MRAM cell comprising:
    a bottom electrode layer;
    a magnetic reference layer;
    a synthetic pinned layer including a pinning layer, a first magnetic layer, a first AF coupling layer, and a second magnetic layer;
    an insulating layer;
    a synthetic free layer including a third magnetic layer, a second AF coupling layer, and a fourth magnetic layer; and
    a top electrode layer.

23. The MRAM cell as in claim 22 in which the pinning layer in the synthetic pinned layer comprises the material PtMn.

24. The MRAM cell as in claim 22 in which the first magnetic layer in the synthetic pinned layer comprises a material selected from the group consisting of CoFeB, CoFe, CoFeNi, and a bilayer of NiFe/CoFe.

25. The MRAM cell as in claim 22 in which the first magnetic layer in the synthetic pinned layer comprises a magnetic layer about two to six run thick.

26. The MRAM cell as in claim 22 in which the first AF coupling layer in the synthetic pinned layer comprises a ruthenium layer.

27. The MRAM cell as in claim 22 in which the first AF coupling layer in the synthetic pinned layer comprises a layer about 0.6 to one nm thick.

28. The MRAM cell as in claim 22 in which the second magnetic layer in the synthetic pinned layer comprises a material selected from the group consisting of CoFeB, CoFe, and a bilayer of NiFe/CoFe.

29. The MRAM cell as in claim 22 in which the second magnetic layer in the synthetic pinned layer comprises a magnetic layer about two to six nm thick.

30. The MRAM cell as in claim 22 in which the first magnetic layer of the synthetic pinned layer is thicker than the second magnetic layer of the synthetic pinned layer.

31. The MRAM cell as in claim 22 in which the magnetic reference layer comprises a synthetic magnetic reference layer.

32. The MRAM cell as in claim 22 in which the magnetic reference layer comprises a material selected from the group consisting of CoFeB, CoFe, CoFeNi, and a bilayer of NiFe/CoFe.

33. The MRAM cell as in claim 22 in which the third magnetic layer in the synthetic free layer comprises a material selected from the group consisting of CoFeB, CoFe, CoFeNi, and a bilayer of NiFe/CoFe.

34. The MRAM cell as in claim 22 in which the third magnetic layer in the synthetic free layer comprises a magnetic layer about two to six nm thick.

35. The MRAM cell as in claim 22 in which the second AF coupling layer in the synthetic free layer comprises a ruthenium layer.

36. The MRAM cell as in claim 22 in which the second AF coupling layer in the synthetic free layer comprises a layer about 0.6 to one nm thick.

37. The MRAM cell as in claim 22 in which the fourth magnetic layer in the synthetic free layer comprises a material selected from the group consisting of CoFeB, CoFe, and a bilayer of NiFe/CoFe.

38. The MRAM cell as in claim 22 in which the fourth magnetic layer in the synthetic free layer comprises a magnetic layer about two to six nm thick.

39. The MRAM cell as in claim 22 in which the third magnetic layer of the synthetic free layer is thicker than the fourth magnetic layer of the synthetic free layer.

* * * * *